United States Patent
Shibib

(12) 
(10) Patent No.: US 6,576,506 B2
(45) Date of Patent: Jun. 10, 2003

(54) ELECTROSTATIC DISCHARGE PROTECTION IN DOUBLE DIFFUSED MOS TRANSISTORS

(75) Inventor: Muhammed Ayman Shibib, Wyomissing, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/896,669

(22) Filed: Jun. 29, 2001

(65) Prior Publication Data

US 2003/0001199 A1 Jan. 2, 2003

(51) Int. Cl.[7] ................... H01L 21/336; H01L 21/8234
(52) U.S. Cl. ................... 438/197; 438/271; 438/983
(58) Field of Search ............... 438/42, 81, 220, 438/221, 222, 270, 271, 197, 296, 311, 330, 381, 524, 680, 681, 689, 697, 700, 712, 983

(56) References Cited

U.S. PATENT DOCUMENTS 5,877,534 A * 3/1999 Williams et al. ............ 257/355
6,365,932 B1 * 4/2002 Kouno et al. ................ 257/341

* cited by examiner

*Primary Examiner*—David Nelms
*Assistant Examiner*—David Nhu
(74) *Attorney, Agent, or Firm*—Peter V. D. Wilde

(57) ABSTRACT

The specification describes a DMOS transistor that is fully integrated with an electrostatic protection diode (ESD). The ESD diode is isolated from the DMOS device by a trench. The trench is metallized to tie the guard ring of the ESD to the substrate thereby increasing the current handling capabilities of the ESD. The trench also provides a convenient buried contact to the RF ground.

6 Claims, 6 Drawing Sheets

ELECTROSTATIC DISCHARGE PROTECTION IN DOUBLE DIFFUSED MOS TRANSISTORS

FIELD OF THE INVENTION

The field of this invention is design and fabrication of MOS transistors. More specifically it involves protection of double diffused MOS (DMOS) transistors from electrostatic discharge (ESD).

BACKGROUND OF THE INVENTION

DMOS transistors are used widely in both RF analog and mixed-signal integrated circuits (ICs), in dielectrically isolated ICs for power and high voltage applications, and as discrete devices. It is known that these devices, in common with many types of electronic components, are susceptible to electrostatic discharge (ESD). Sources of static discharge are common in the use environment, and also occur during transistor manufacture. The latter can be controlled, but managing static or other forms of high voltage to which electronic equipment is exposed during use of the equipment requires static protection that is built into the device itself. Thus, typical DMOS transistor circuits have electrical devices, typically diodes, incorporated into the integrated circuit package.

It is most convenient, and cost effective, to integrate the protection diode into the integrated circuit itself. See for example, U.S. Pat. Nos. 4,763,184, 5,463,520, and 5,304,839. The diode in these arrangements is isolated from the active circuit by a variety of p-n junction isolation techniques.

In the case of discrete DMOS devices, it is not desirable to add processing steps to integrate the ESD protection on the same chip as the discrete device. Accordingly, with many discrete devices with ESD protection, discrete ESD protection diodes, typically Zener diodes, are used. In these arrangements the Zener diode can be mounted on the same board as the device and can thus be made relatively small. However, the ESD protection device adds cost and assembly complexity as compared with an integrated ESD device.

As the lithography of the DMOS devices shrinks, and the gate dielectric becomes thinner, effective ESD, especially in an integrated form, becomes more demanding for RF applications. Further, restrictions on the ESD protection scheme of the DMOS is imposed because of the high frequency operation of the device. The main ESD protection needed is primarily between the gate and the source terminals (the input in an RF amplifier). Adding any type of ESD structure should not increase appreciably the capavitance (gate to source, or input capacitance) otherwise the RF characteristics of the amplifier will be degraded. Thus, integrating the ESD protection to control the parasitics is particularly important for RF applications. From this discussion it should be evident that there remains a need for better techniques to protect sensitive devices against accidental high voltage discharge.

STATEMENT OF THE INVENTION

I have developed an improved MOS transistor device design and fabrication method that addresses ESD protection. It is a fully integrated design with improved isolation between the ESD device and the integrated circuit. In the preferred embodiment the MOS transistor is a DMOS device. The ESD protection method of the invention relies on standard IC production steps in which a Zener diode and the equivalent circuit structure of FIG. 1, are produced in the IC substrate. The Zener diode, and the other elements, are formed using the same process steps used to fabricate the DMOS devices. A heavily doped guard ring structure is formed around the p-n junction of the Zener diode. A V-groove or trench is etched around the p-n junction and guard ring down to the buried source region and the V-groove or trench is metallized to short the guard ring to the source. This structure provides effective ESD isolation from the DMOS IC devices, with enhanced current capacity in the Zener diode due to the low resistance (metallized) current path between the guard ring and ground. The structure is completely process compatible with the process design for the DMOS devices.

DETAILED DESCRIPTION

For the purpose of illustrating the integrated ESD structure/MOS transistor structure of the invention a lateral DMOS (LDMOS) transistor is chosen by way of example. The invention is applicable to vertical DMOS devices, and to other MOS devices, for example BICMOS devices, or even bipolar devices, in which adverse ESD effects can be addressed by incorporating a protection diode into the integrated circuit.

Figure 1:
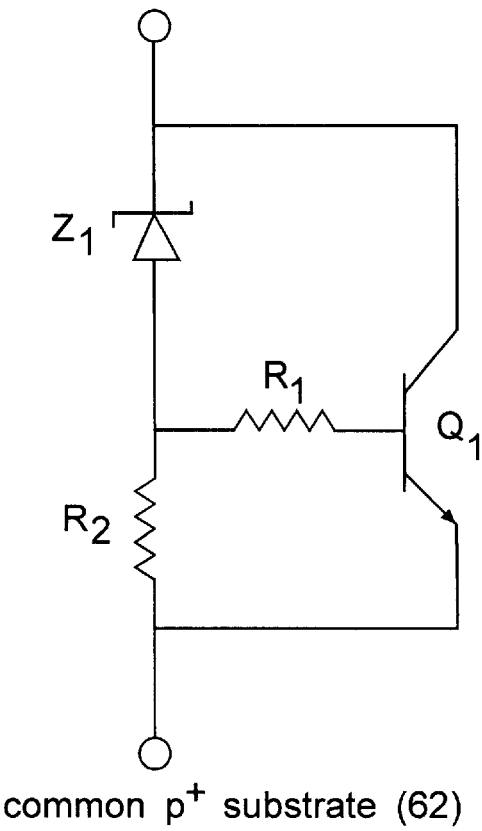
FIG. 1 is a schematic circuit diagram for the ESD device of the invention.
Figure 2:
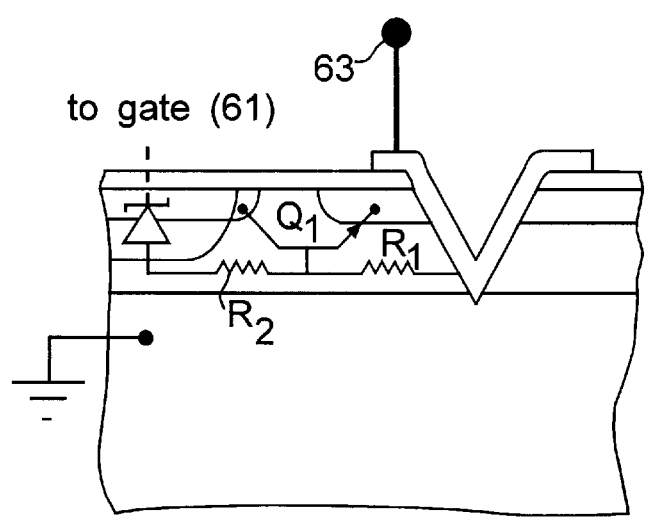
FIG. 2 is a schematic diagram showing the correspondence between the circuit elements of FIG. 1 and the IC structure of the invention.

The ESD structure is represented by the circuit of FIG. 1 and comprises Zener diode $Z_1$. The integrated elements that will be described in more detail below are shown in FIG. 2.

Figure 3:
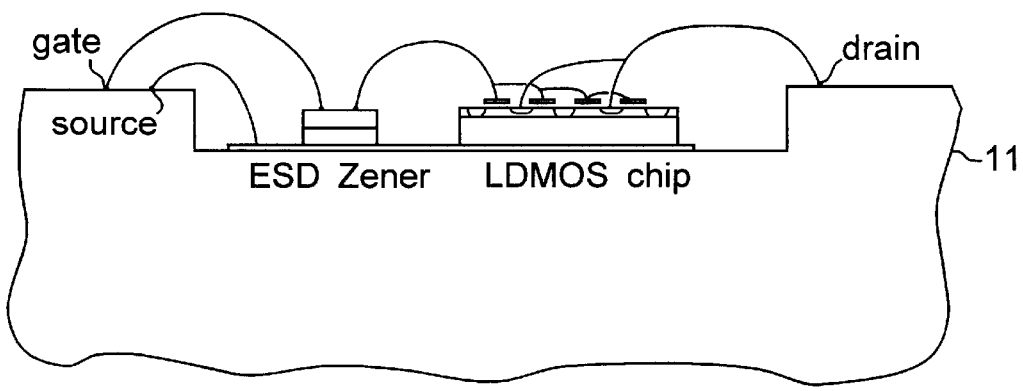
FIG. 3 is a schematic view of a DMOS device with the conventional form of isolated ESD diode protection.

For comparison purposes, an LDMOS structure with a standard ESD protection diode is shown in FIG. 3, with the electrical interconnections in largely schematic form. The common substrate is shown at 11, the LDMOS transistor at 12 and the Zener diode at 13. The source, drain and gate connections are shown schematically. The LDMOS device and the Zener diode share a common platform, which may be a ceramic interconnect substrate, or a printed wiring board. This arrangement provides effective isolation but the two devices are not fully integrated. Consequently, this circuit is relatively large, and costly to assemble and package. Moreover, as mentioned earlier, the arrangement of FIG. 3 may introduce parasitic capacitances and inductances that can degrade RF performance.

Figure 4:
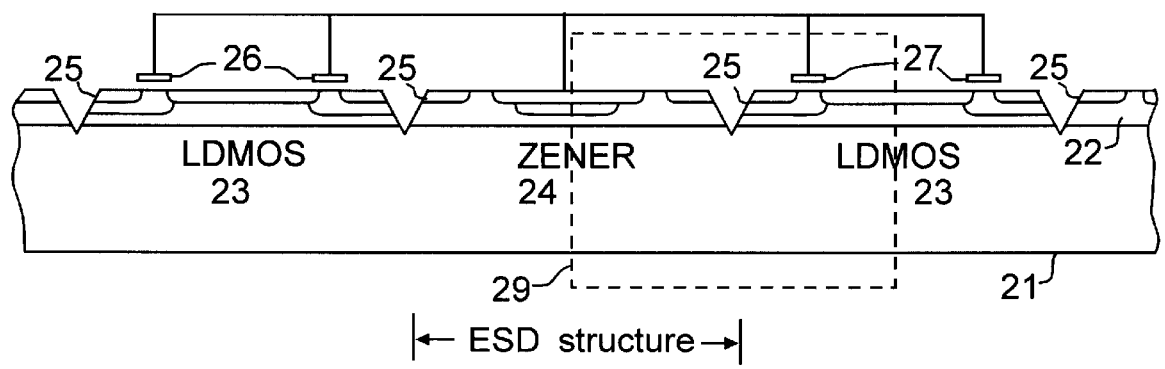
FIG. 4 is a schematic view similar to FIG. 1 showing the integrated form of DMOS device and ESD protection of the invention.

A fully integrated IC device, according to the invention, is shown in FIG. 4. The device comprises a $p^+$ silicon substrate 21 with $p^-$ epitaxial layer 22. The figure shows a portion of a larger substrate with many devices in a typical silicon wafer. For illustration, an n-channel RF device is shown. However, the invention applies equally to the complementary p-type DMOS device as well as other kinds of transistors with MOS gates.

Referring again to FIG. 4, two LDMOS devices 23 are shown with ESD structure 24 providing ESD protection to the gates of both. Complete isolation between the source and drain of the LDMOS devices and the Zener diode is provided by V-grooves 25. The Zener diode is connected to gates 26 and 27 of the LDMOS devices as shown schematically in the figure. The gate 26 and the gate 27 appear in the figure as two elements but those skilled in the art will recognize that these gates a circular so that 26 for example is a single gate electrode. Further details of the LDMOS device will be shown and described in later figures directed to the fabrication of the integrated circuit. As stated earlier, the isolation grooves that surround the ESD structures described here may be V-grooves or trenches. For convenience in exposition here, and for the purpose of definition in the claims below, the term trench will be used as a generic term to define a groove of any shape.

In the following detailed description, the sequence of fabrication steps are given by way of example. Variations in the steps may be made, and steps omitted or other steps substituted, without departing from the invention. It will be recognized that the drawing is not to scale. Relative size of the various elements may be exaggerated for illustrative purposes.

A fabrication technique according to the invention will be described in conjunction with FIGS. 5–17. The invention is directed to the isolation between an MOS transistor body and a Zener diode body so these figures show just the gate, source, and drain elements of a single transistor device, and the p-n junction of the Zener diode. This portion of the chip is shown in box 29 of FIG. 4. It will be understood that these elements comprise a portion of a much larger integrated circuit chip. As mentioned above, the figures are directed to a preferred embodiment of the invention where the gate, source, and drain are shown as part of an LDMOS device, with an extended LDD region adjacent the drain.

It will be understood by those skilled in the art that the process steps described here that require selective processing can be achieved by well known photolithographic masking techniques, and standard etching, ion implantation, oxide growth or deposition as required, metal deposition and patterning, etc. These various process steps are sufficiently established in the IC wafer fabrication art that the details are unnecessary to the practice of the invention.

Also for clarity and brevity, masking layers in some cases are not illustrated.

Figure 5:
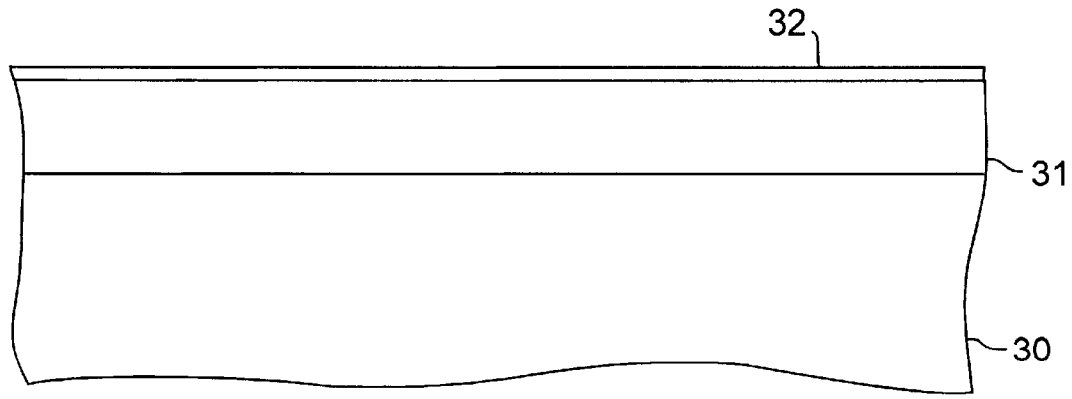
FIGS. 5–17 are schematic representations of a suitable process step sequence for forming the integrated DMOS/ESD diode.

With reference to FIG. 5, a cutaway portion of a larger substrate is shown. The substrate 30 comprises <100> oriented silicon doped $p^+$ with $p^-$ epi layer 31. After standard cleaning, the epi layer 31 is oxidized, preferably thermally, to form the gate dielectric layer 32. The thickness of the thin gate dielectric layer may be 20–1000 Angstroms.

Figure 6:
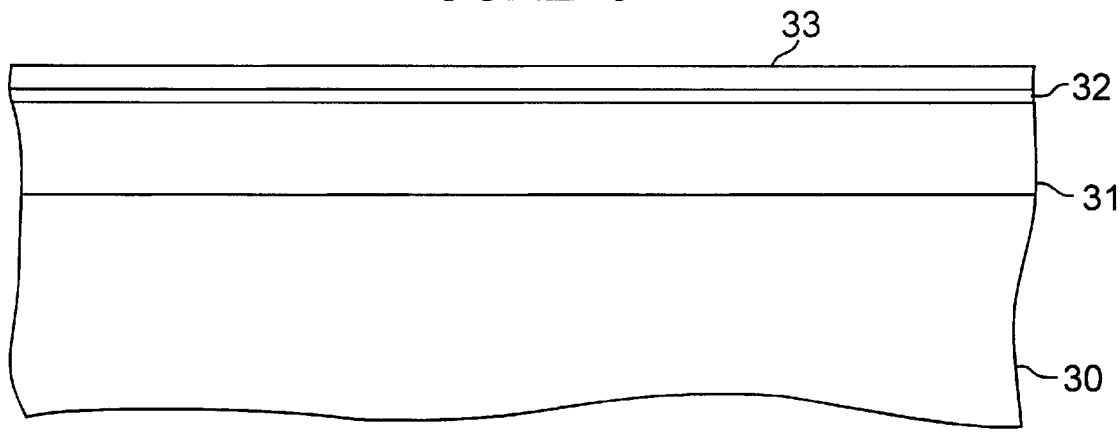
Figure 7:
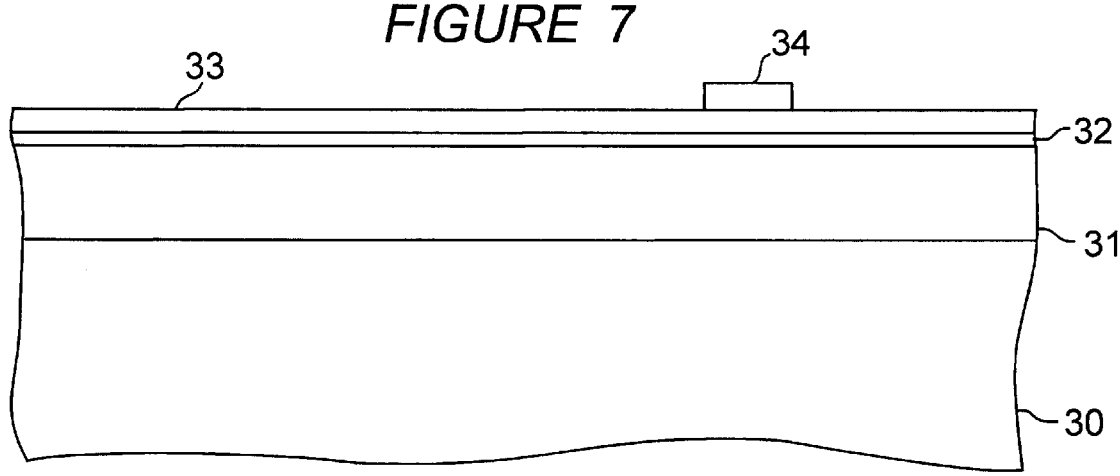
Figure 8:
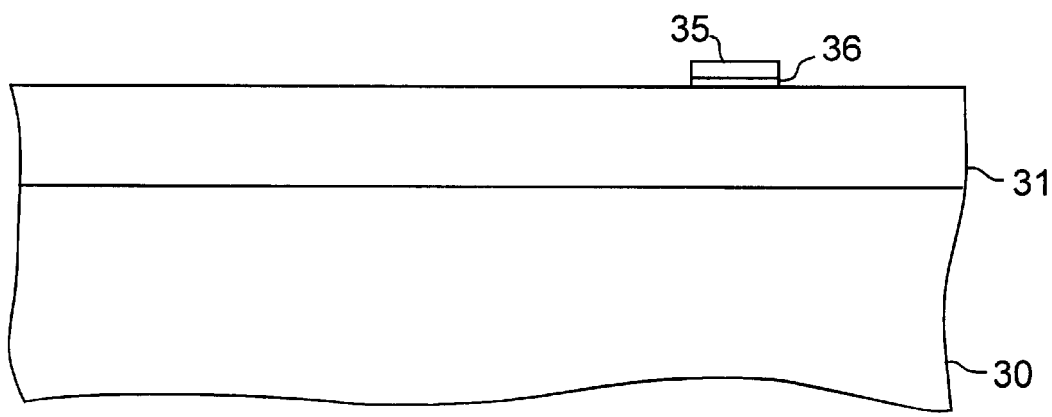

With the gate dielectric layer 32 in place, the polysilicon gate layer 33 is blanket deposited over the structure as shown in FIG. 6. Typically the polysilicon layer is deposited by chemical vapor deposition (CVD) or plasma-enhanced CVD (PE-CVD), and is heavily doped n-type for an n-channel transistor. The gate layer thickness may be in the range 1500–5000 Å. If desired the polysilicon layer may be silicided by deposition of a tantalum, titanium, or tungsten layer, and heated to form the silicide. This expedient, which is optional, is especially useful for high frequency RF devices as the one described here. Alternatively, salicide techniques can be employed to form the silicide after patterning the gate layer to form the gate. The gate layer 33 is masked with a lithographic mask 34, as shown in FIG. 7, and patterned by conventional etching to define gate 35 as shown in FIG. 8. The mask by be standard photoresist, but is preferably an oxide hard mask formed by TEOS deposition and standard photoresist patterning. When reference is made herein to photoresist or to lithography it will be understood to include e-beam or x-ray lithography as well as conventional UV lithography. An anti-reflection coating may be applied to the surface of the oxide hardmask to improve edge acuity in defining the gate structures. The gate dielectric layer may be etched using the patterned polysilicon gate 35 as a mask, as shown at 36. This etch step is typically performed in a plasma etch apparatus in sequence with the polysilicon etch step. The gate dielectric etch step is optional since the implant steps used to form the impurity regions described below may be made effectively through the gate dielectric layer.

The next several steps involve the formation of additional impurity regions within the substrate. A variety of options are available in the sequence used to form these elements. The sequence described here allows the source and LDD regions, as well as the p-body implant, to be self-aligned to the gate.

Figure 9:
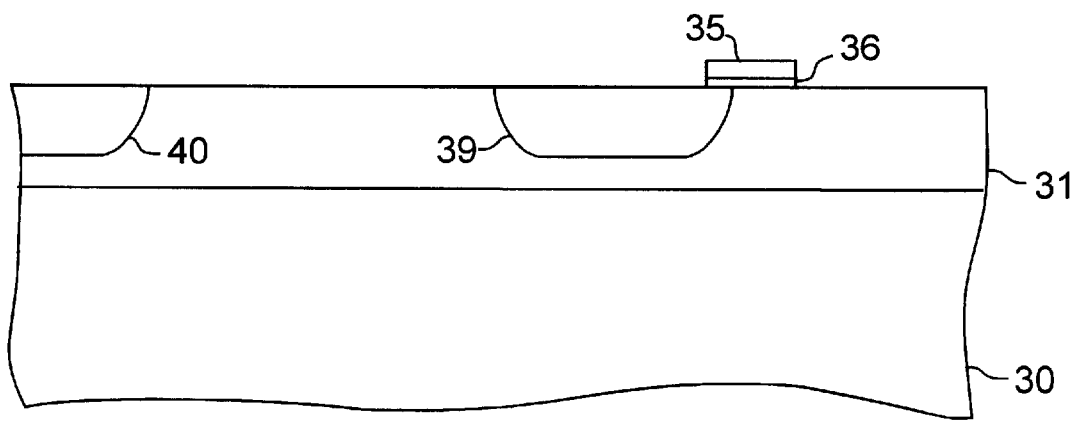

FIG. 9 shows the p-body region 39 selectively implanted into the epi layer 31 using the gate as a partial mask for self-alignment. In the same step, the p-type region 40 for the Zener diode is formed. This step, as well as those that follow, show how the fabrication of the ESD Zener diode may be fully integrated into the base process for the LDMOS device. The p-body layer 39, and the p-region 40 of the diode, may be formed in this example by a boron implant at a dose of 1E14 and energy of 30 kEV, followed by a drive for 60 min. at 1200° C.

Figure 10:
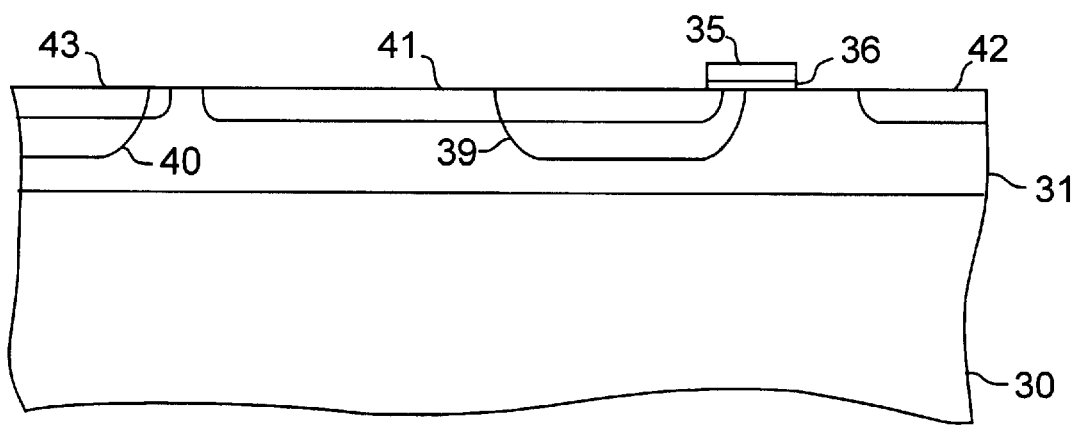

The source 41 and primary drain 42 are then implanted as shown in FIG. 10 using a standard implant. As will be appreciated the source implant 41 is effectively self aligned to the gate. At the same time the source drain implant for the LDMOS device is performed, the n-region 43 of the p-n junction for the Zener diode is formed. The source region 41 extends substantially toward the left of the figure, i.e. toward the n-region 43. As will be seen below, a portion of this implanted region will form the guard ring for the Zener diode. Also, n-region 43 is made larger in diameter than p-region 40 so that the Zener diode is effectively buried. The implanted n-regions may be formed by conventional arsenic implant and drive. A standard arsenic implant, 3.0E15 at 160 kEV, may be used to form the n-regions shown.

Figure 11:
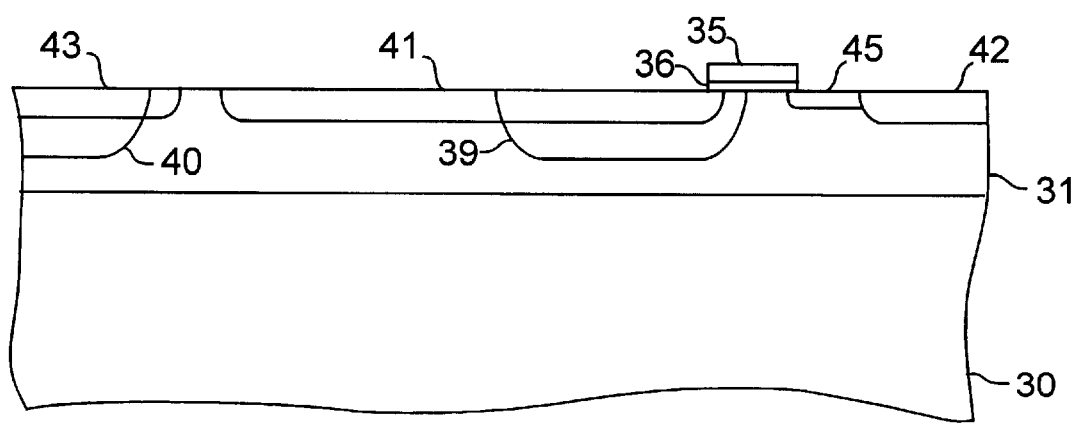
Figure 12:
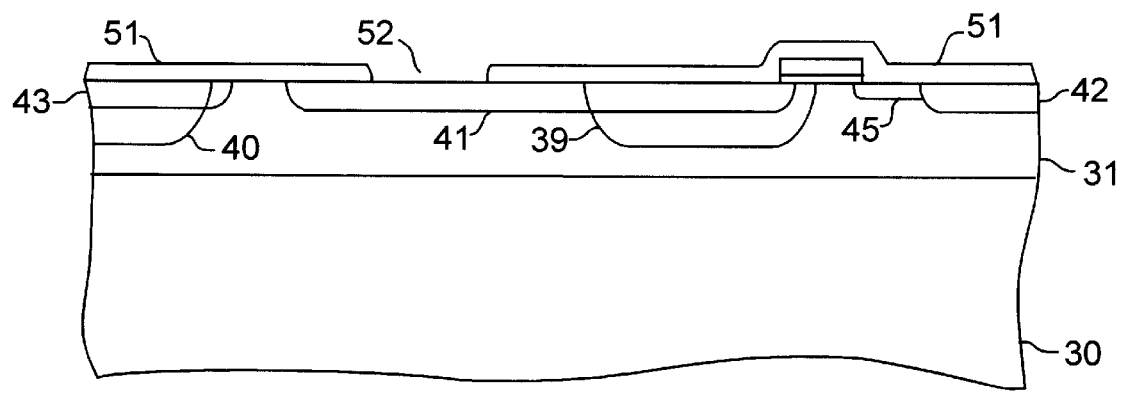

The $n^-$ LDD implant is made at 45 as shown in FIG. 11 and connects the primary drain 42 to the channel. As shown, the LDD 45 is self-aligned to the gate 45. The LDD implant is typically the same as the drain implant but with a smaller dose, e.g. $5E12$ cm$^{-2}$. The separation between the primary drain 42 and the channel may be 2–3 microns, yielding a breakdown of, e.g., greater than 50 volts. In the conventional process, the steps just described essentially complete the wafer substrate processing up to metallization. However, in the process of the invention, the isolation between the LDMOS device and the Zener diode is formed by masking the structure with mask 51 as shown in FIG. 12. The opening 52 in the mask is aligned so that it overlies a middle portion of n-region 41. This mask is preferably an oxide mask, but alternatively may be photoresist or other suitable mask. The deep V-grooves, represented by the single groove 53, are formed between the ESD structure and the LDMOS, with a portion 54 of n-region 41 separated from the LDMOS region and contained within the Zener diode region. The n-region 54 forms the emitter of transistor $Q_1$ in the equivalent circuit of the ESD structure as shown in FIGS. 1 and 2. It also will be tied electrically directly to the $p^+$ substrate as will be shown.

Figure 13:
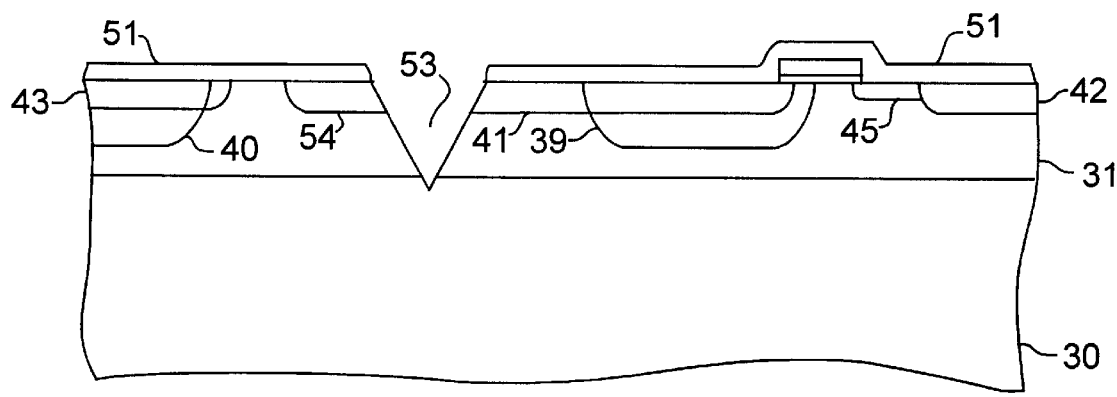

Trenches 53 may be etched using any suitable etch technique. In the embodiment described they are wet etched using hot KOH, and therefore are shown in FIG. 13 as V-shaped. Alternatively, they may be dry etched with either an isotropic or anisotropic RIE technique. In the latter case the groove shape will be essentially rectangular. This etch approach may be preferred from the standpoint of conserving chip area. Trenches may be etched several microns deep, with aspect ratios as large as 4, or more by known techniques.

Figure 14:
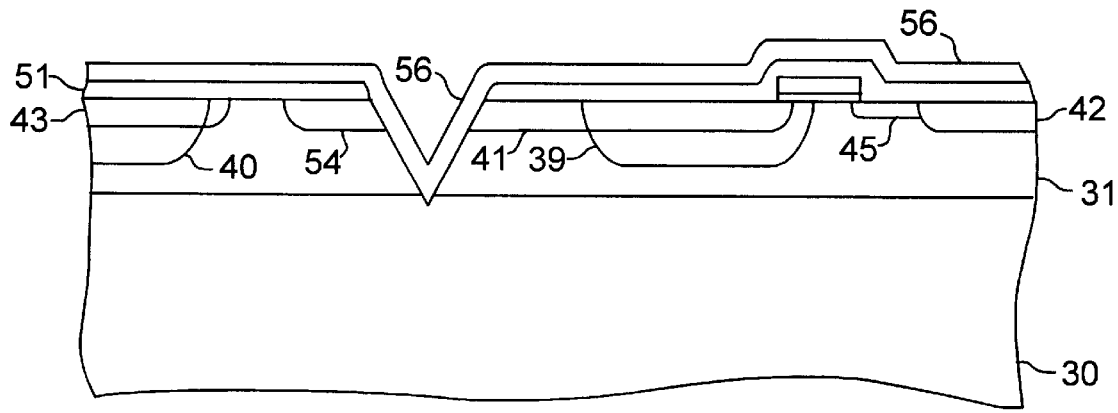
Figure 15:
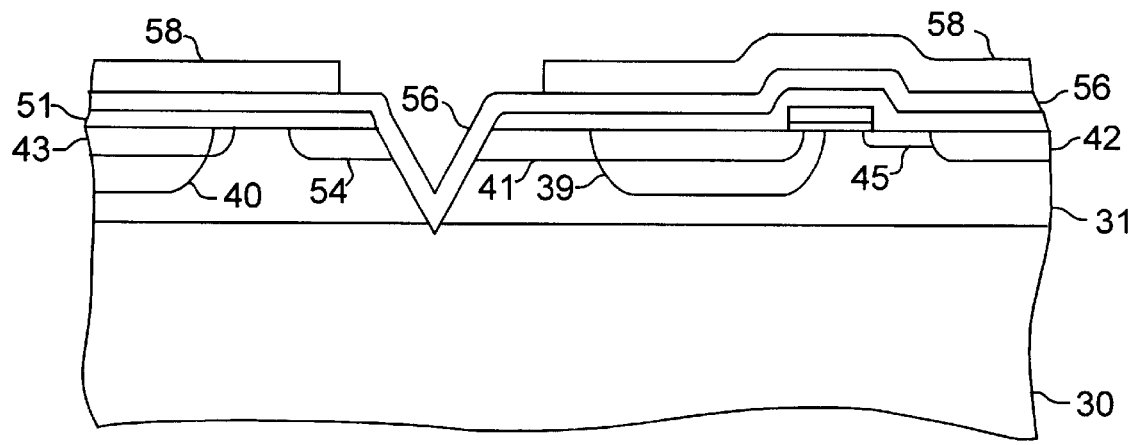
Figure 16:
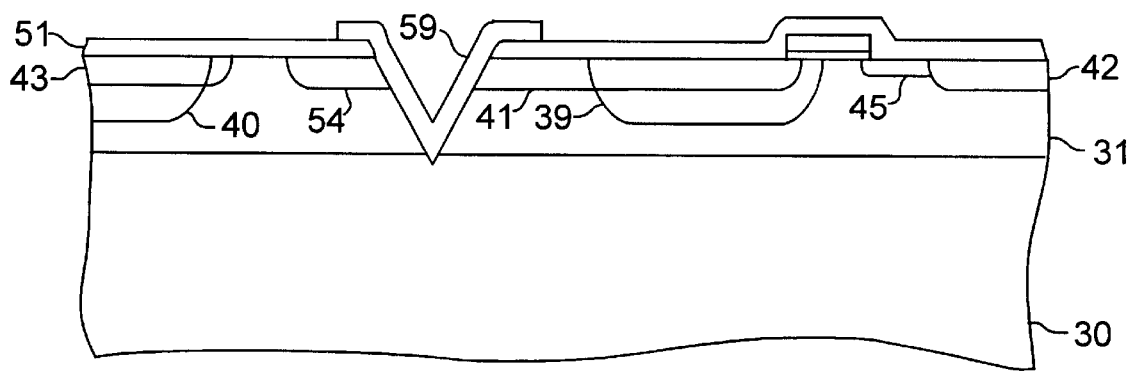
Figure 17:
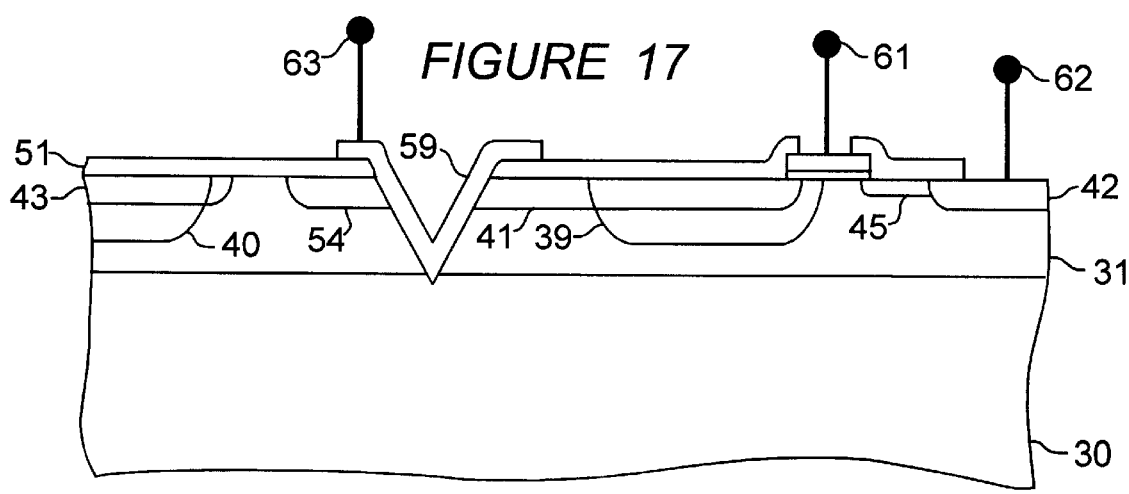

At this point in the process there are several options available for completing the device. Drain and gate contact windows could be opened during the trench etch, but the trench etch is relatively severe and preferably done separately. After the trench etch is complete, a blanket layer 56 of metal is deposited on the structure and into the trenches as shown in FIG. 14. The layer 56 is masked with mask 58, as shown in FIG. 15, and patterned as shown in FIG. 16 to form metal contacts 59 in the trenches. Optionally, the metallization for the trench may be formed at the same time as the drain and source contacts.

An important feature of the metallization 59 in the trench is that it electrically ties the emitter 54 of $Q_1$ to substrate 30, thereby improving the current handling capabilities of the ESD structure. At this point it should be evident that the metallized trench according to the invention serves three useful functions. It provides electrical isolation between the DMOS device and the ESD; it allows a convenient contact from the surface of the device to the buried source (RF ground); and, as just mentioned, it ties the emitter of the ESD structure to ground.

The device is completed by forming the source, drain, and gate contacts. Typically this involves patterning oxide layer 51 to form contact windows, or depositing an additional oxide layer and forming contact windows. Aluminum or gold metallization may be formed over the patterned structure and itself patterned to form the metallization for the IC. A standard SINCAP or polyimide layer (not shown) is deposited to passivate the final IC structure. The contacts are shown schematically in FIG. 17, with gate 61, drain 62, and source (RF ground) 63. The gate 61 is tied to the $n^+$ region of the ESD structure by means not shown.

Reference made herein to silicon gate, polysilicon gate, etc. are intended to refer to silicon gates of polycrystalline silicon or amorphous silicon. The gates are preferably salicided to produce very low resistance.

It will be evident to those skilled in the art that the principle and process of the invention may be applied to advantage to a variety of MOS devices. These devices may or may not have an LDD as described above, so for purposes of defining the invention, reference to a drain or drain region adjacent the gate includes both devices with and without an LDD.

Reference to selective deposition, or selectively depositing, means forming material on selected portions of a body by either an additive or subtractive method. Selectively depositing metal on the trench means depositing metal to cover the sidewalls and bottom of the trench and an overhang onto the surface of the substrate containing the trench, as illustrated in the figures.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. A method for fabricating an MOS transistor integrated with an electrostatic protection structure comprising the steps of:
   a. forming an MOS transistor by steps comprising:
      i. growing a gate dielectric layer on a gate region of a semiconductor substrate,
      ii. depositing a gate layer on the gate dielectric layer,
      iii. selectively etching the gate layer to form a gate on a portion of the gate dielectric layer,
      iv. forming a source region and a drain region in the semiconductor substrate adjacent the gate,
   e. forming a p-n junction diode in the substrate, the p-n junction diode spaced laterally from the MOS transistor,
   f. forming an isolation trench in the substrate between the MOS transistor and the p-n junction diode, the trench comprising sidewalls in the substrate,
   g. selectively depositing a metal layer on the sidewalls, and
   h. electrically connecting the p-n junction diode to the gate.

2. The method of claim 1 wherein the substrate is silicon.

3. The method of claim 2 wherein the gate layer is polysilicon.

4. A method for fabricating an DMOS transistor integrated with an electrostatic protection structure (ESD) in a common substrate, the substrate comprising a silicon body covered with an epitaxial silicon layer, the epitaxial layer having a first region for the DMOS transistor and designated the DMOS region, a second region for the ESD designated the ESD region, and an isolation space between the DMOS region and the ESD region, the method comprising the steps of:
   a. growing an MOS gate dielectric layer on the DMOS region,
   b. depositing a polysilicon gate layer on the MOS gate dielectric layer,
   c. selectively etching the polysilicon gate layer to form a polysilicon gate on a portion of the gate dielectric layer,
   d. selectively implanting p-type impurities simultaneously into:
      i. a first DMOS region adjacent to the polysilicon gate, and
      ii. a first ESD region,
   e. selectively implanting n-type impurities simultaneously into:
      i. a second DMOS region adjacent to the polysilicon gate to form a source,
      ii. a third DMOS region spaced from the polysilicon gate to form a drain, and
      iii. the first ESD region to form a p-n junction diode,
   f. implanting n-type impurities into the silicon substrate to form a lightly doped drain (LDD) between the polysilicon gate and the drain,
   g. etching the epitaxial layer in the isolation space to produce a trench extending from the surface of the substrate to the silicon body,
   h. selectively depositing a metal layer on the trench.

5. The method of claim 4 wherein the n-type impurities implanted in step e. iii. are implanted into a second ESD region and the second ESD region is larger than the first ESD region.

6. The method of claim 4 wherein step e. additionally includes implanting n-type impurities into the ESD region to form a guard ring, and the trench is formed to intersect the guard ring thereby electrically connecting the guard ring and the silicon body by the metal layer.

* * * * *